US009245059B2

(12) United States Patent
Trif

(10) Patent No.: US 9,245,059 B2
(45) Date of Patent: Jan. 26, 2016

(54) SYSTEM AND METHOD FOR DETERMINING A LOCATION WITHIN COMPLEX STRUCTURES USING PSEUDORANDOM ENCODING TECHNIQUES

(76) Inventor: Niculaie Trif, Gatineau (CA)

(*) Notice: Subject to any disclaimer, the term of this patent is extended or adjusted under 35 U.S.C. 154(b) by 968 days.

(21) Appl. No.: 13/434,675

(22) Filed: Mar. 29, 2012

(65) Prior Publication Data

US 2013/0262043 A1 Oct. 3, 2013

(51) Int. Cl.
*G06F 17/50* (2006.01)

(52) U.S. Cl.
CPC ....................... *G06F 17/50* (2013.01)

(58) Field of Classification Search
CPC ................. G06F 17/00; G06F 17/50
USPC ................. 703/1; 345/419–420; 700/97–98
See application file for complete search history.

(56) References Cited

U.S. PATENT DOCUMENTS

| 6,262,737 B1* | 7/2001 | Li et al. ........................ 345/419 |
| 2013/0063417 A1* | 3/2013 | Trojanova et al. ............ 345/419 |

OTHER PUBLICATIONS

Sakr "3D Objection Recognition Using Pseudo-random color Encoded Structured Light". 2000. University of Ottawa., 129 Pages.*
Kazantsev et al. "Robust Pseudo-Random coded Colored Structured Light Technique for 3D Object Model Recovery". IEEE 2008., 6 Pages.*

Petriu et al. "Neural Network Modeling Techniques for the Real-Time Rendering of the Geometry and Elasticity of 3D Objects". 2007 IEEE. 6 Pages.*
Petriu, Emil M; Trif, Niculae; McMath, William; Yeung, Steven K; An Application of the Pseuudo-Random Multi-valued Grid Encoding to 3D Object Recognition; Canadian Workshop; 1993, p. 23.
Yeung, S.K.; McMath, W.S.; Petriu, E.M., Trif, N.; Three Dimensional Object Recognition Using Integrated Robotic Vision and Tactile Sensing; IEEE/RSJ International Workshop on Intelligent Robots and Systems IROS 1991, Nov. 3-5, Osaka, Japan, pp. 1370-1373.
Petriu, Bieseman, Trif, McMath, Yeung; Visual Object Recognition Using Pseudo-Randodm Grid Encoding; Proceedings of the 1992 IEEE/RSJ International Conference on Intelligent Robotics and Systems, Raleigh, NC, Jul. 7-10, 1992; pp. 1617-1624.
Petriu, McMath, Yeung, Trif, Biesemen; Two-Dimentionsl Position Recovery for a Free-Ranging Automated Guided Vehicle; IEEE Transactions on Instruments and Measurement, vol. 42, No. 3, Jun. 1993, pp. 701-706.

(Continued)

*Primary Examiner* — Eunhee Kim
(74) *Attorney, Agent, or Firm* — Ziegler IP Law Group, LLC

(57) ABSTRACT

A system and method for determining a location within a physical structure are described. The location within the physical structure can be determined by storing a model of a physical structure comprising a plurality of nodes connected by a plurality of struts, each of the nodes and struts of the model corresponding to respective nodes and struts of the physical structure; assigning a non-unique ID to each node of the model according to a pseudo-random sequence, wherein each node of the physical structure encodes the non-unique ID assigned to the corresponding node of the model; receiving a set of non-unique IDs encoded onto respective nodes of a contiguous subset of nodes of the physical structure; locating a set of non-unique IDs in the model corresponding to the received set of non-unique IDs; and determining a location in the physical structure from the located set of non-unique IDs in the model.

29 Claims, 11 Drawing Sheets

(56) References Cited

OTHER PUBLICATIONS

MacWilliams, Sloane; Pseudo-Random Sequnces and Arrays; Proceedings of the IEEE, vol. 64, No. 12, Dec. 1976, pp. 1715-1729.

Trif, Niculaie; Model-Based Visual Recognition of 3-D Objects Using Pseudo-Random Grid Encoding; Ottawa-Carleton Institute for Electrical Engineering, University of Ottawa, Ontario, Canada, May 1993.

* cited by examiner

| Shift Register Length | Feedback for PRBS |
|---|---|
| 4 | $R(0) = R(4) \oplus R(1)$ |
| 5 | $R(0) = R(5) \oplus R(2)$ |
| 6 | $R(0) = R(6) \oplus R(1)$ |
| 7 | $R(0) = R(7) \oplus R(3)$ |
| 8 | $R(0) = R(8) \oplus R(4) \oplus R(3) \oplus R(2)$ |
| 9 | $R(0) = R(9) \oplus R(4)$ |
| 10 | $R(0) = R(10) \oplus R(3)$ |

400

406

| | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| 1 | 0 | 0 | 0 | 1 | 0 | 1 | 0 | 1 | 0 | 1 | 0 | 0 | 0 | 1 | 1 | 0 | |
| 2 | 0 | 0 | 1 | 1 | 0 | 1 | 0 | 1 | 0 | 1 | 1 | 0 | 0 | 1 | 0 | 0 | 1 |
| 3 | 1 | 1 | 0 | 0 | 0 | 1 | 0 | 1 | 0 | 0 | 0 | 1 | 1 | 1 | 1 | 1 | 1 |
| 4 | 1 | 0 | 1 | 0 | 1 | 1 | 0 | 1 | 1 | 0 | 1 | 0 | 1 | 1 | 1 | 1 | 1 |
| 5 | 0 | 0 | 1 | 0 | 0 | 0 | 0 | 0 | 0 | 0 | 1 | 0 | 0 | 1 | 1 | 1 | 1 |
| 6 | 1 | 1 | 1 | 1 | 0 | 0 | 0 | 0 | 0 | 1 | 1 | 1 | 1 | 0 | 1 | 1 | 0 |
| 7 | 0 | 1 | 1 | 0 | 1 | 0 | 0 | 0 | 1 | 0 | 1 | 1 | 0 | 0 | 0 | 0 | 0 |
| 8 | 1 | 0 | 0 | 0 | 1 | 1 | 0 | 1 | 1 | 0 | 0 | 0 | 1 | 0 | 0 | 0 | 0 |
| 9 | 1 | 1 | 0 | 1 | 0 | 0 | 0 | 0 | 1 | 0 | 1 | 1 | 1 | 0 | 0 | 0 | 1 |
| 10 | 1 | 0 | 0 | 1 | 1 | 0 | 0 | 0 | 1 | 1 | 0 | 0 | 1 | 0 | 1 | 1 | 0 |
| 11 | 1 | 1 | 1 | 0 | 0 | 1 | 0 | 1 | 0 | 0 | 1 | 1 | 1 | 0 | 0 | 0 | 0 |
| 12 | 0 | 1 | 0 | 1 | 1 | 1 | 0 | 1 | 1 | 1 | 0 | 1 | 0 | 1 | 0 | 0 | 1 |
| 13 | 0 | 1 | 0 | 0 | 1 | 0 | 0 | 0 | 1 | 0 | 0 | 1 | 0 | 1 | 1 | 1 | 1 |
| 14 | 0 | 1 | 1 | 1 | 1 | 1 | 0 | 1 | 1 | 1 | 1 | 1 | 0 | 0 | 1 | 1 | 0 |
| 15 | 1 | 0 | 1 | 1 | 1 | 0 | 0 | 0 | 1 | 1 | 1 | 0 | 1 | 1 | 0 | 0 | 1 |

|  | $Y(0)$ | $Y(1)$ | ... | $Y(j)$ | ... | $Y(2^{k_3})$ |
|---|---|---|---|---|---|---|
| $X(0)$ | $A(0,0)$ | $A(0,1)$ | ... | $A(0,j)$ | ... | $A(0, 2^{k_3} - 2)$ |
| $X(1)$ | $A(1,0)$ | $A(1,1)$ | ... | $A(1,j)$ | ... | $A(1, 2^{k_3} - 2)$ |
| ... | ... | ... | ... | ... | ... | ... |
| $X(i)$ | $A(i,0)$ | $A(i,1)$ | ... | $A(i,j)$ | ... | $A(i, 2^{k_3} - 2)$ |
| ... | ... | ... | ... | ... | ... | ... |
| $X(2^{k_3} - 2)$ | $A(2^{k_3} - 2, 0)$ | $A(2^{k_3} - 2, 1)$ | ... | $A(2^{k_3} - 2, j)$ | ... | ... |

Figure 5

| $Y(j)$ \ $X(i)$ | 0 | 1 |
|---|---|---|
| 0 | 0 | 1 |
| 1 | 2 | 3 |

Figure 6

SYSTEM AND METHOD FOR DETERMINING A LOCATION WITHIN COMPLEX STRUCTURES USING PSEUDORANDOM ENCODING TECHNIQUES

TECHNICAL FIELD

The current application relates to a system and method for determining a location in a complex structure, and in particular to a system and method that can be used during assembly of a complex structure.

BACKGROUND

Complex physical structures can be assembled from a limited set of components. The components may include a number of different types of joint nodes that can be connected to other joint nodes by compressive links or tension links, referred to collectively as tensegrity links. The complex physical structure may be comprised of a repeating pattern of connections between the joint nodes. Due to the repeating nature of the complex structure, only a limited number of different types of joint nodes and tensegrity links are required to assemble the complex structure.

Due to the repeating nature of the pattern within the complex structure, it can often be difficult to determine a specific location within the physical structure itself, either as it is being constructed or once it is constructed.

It is desirable to be able to easily determine a particular location within a complex structure, either as it is being constructed, or once it is constructed. If the location is known during the construction stage, it is possible to determine further steps in the construction that can be performed at the particular location.

SUMMARY

In accordance with the description there is provided a method of determining a location within a physical structure comprising: storing a model of a physical structure comprising a plurality of nodes connected by a plurality of struts, each of the nodes and struts of the model corresponding to respective nodes and struts of the physical structure; assigning a non-unique identifier (ID) to each node of the model according to a pseudo-random sequence, wherein each node of the physical structure encodes the non-unique ID assigned to the corresponding node of the model; receiving a set of non-unique IDs encoded onto respective nodes of a contiguous subset of nodes of the physical structure; locating a set of non-unique IDs in the model corresponding to the received set of non-unique IDs; and determining a location in the physical structure from the located set of non-unique IDs in the model.

In accordance with the present disclosure there is further provided a system for determining a location within a physical structure comprising: a memory storing instructions; and a processor for executing instructions stored in the memory, the executed instructions configuring the system to: store a model of a physical structure comprising a plurality of nodes connected by a plurality of struts, each of the nodes and struts of the model corresponding to respective nodes and struts of the physical structure; assign a non-unique identifier (ID) to each node of the model according to a pseudo-random sequence, wherein each node of the physical structure encodes the non-unique ID assigned to the corresponding node of the model; receive a set of non-unique IDs encoded onto respective nodes of a contiguous subset of nodes of the physical structure; locate a set of non-unique IDs in the model corresponding to the received set of non-unique IDs; and determine a location in the physical structure from the located set of non-unique IDs in the model.

BRIEF DESCRIPTION OF THE DRAWINGS

FIG. 4 depicts a pseudorandom binary array and associated window;
FIG. 5 depicts the generation of a pseudorandom product array;
FIG. 6 depicts a product operator for a 2×2 symbol encoding used with a pseudorandom product array.

DESCRIPTION

Figure 1A:
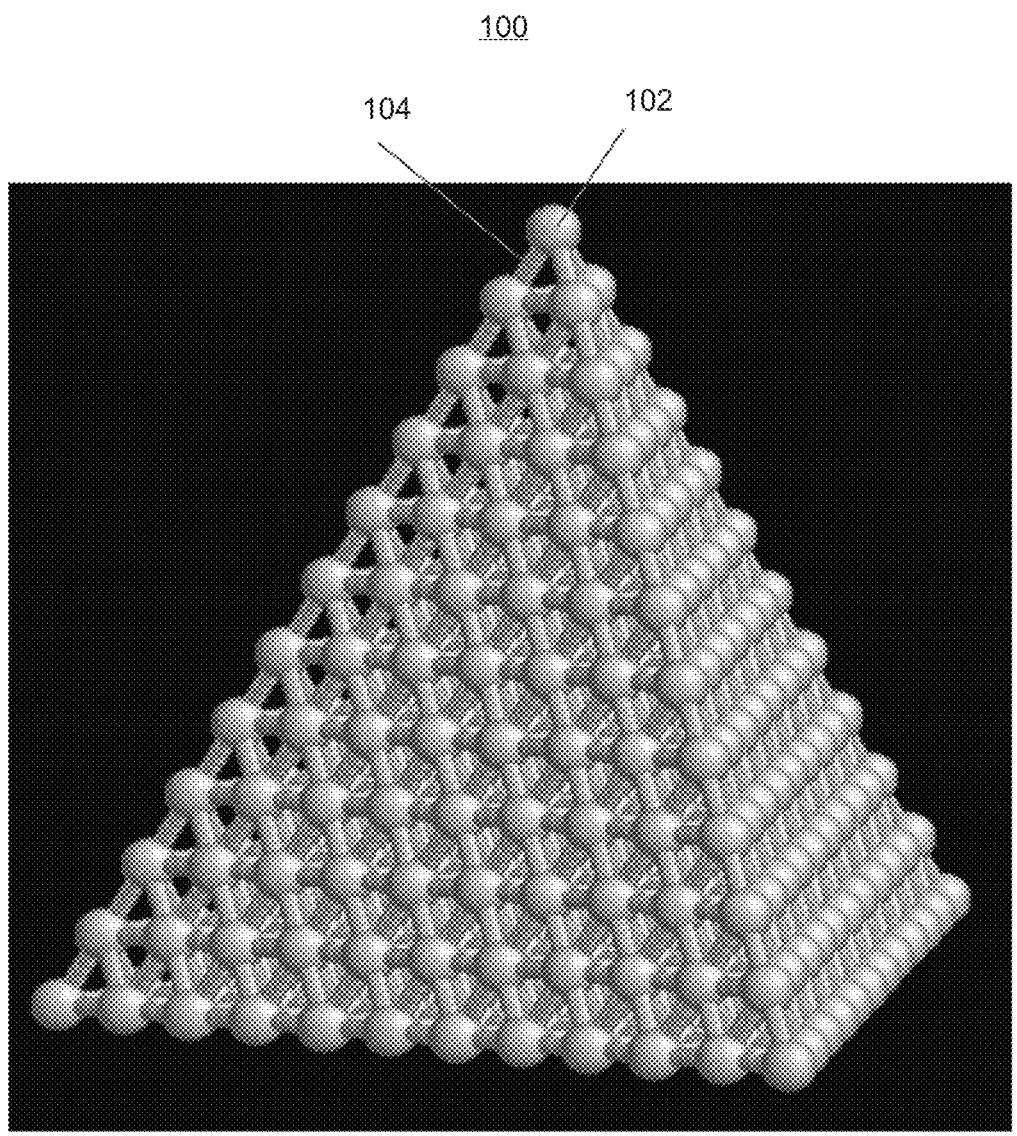
FIG. 1a depicts an example of a complex structure.

System and methods are described herein for determining a location within a complex structure. As described further herein, the determined location may be used to provide further instructions for constructing or assembling the complex structure. The system and methods use a pseudorandom encoding of nodes of the complex structure to determine a location within a corresponding model of the completed complex structure. The location within the physical structure may be determined and provided based on the determined location within the model. Additional information may be provided based on the determined location within the model. For example, based on the determined location within the model, information may be presented regarding subsequent construction or assembly steps to take.

The structures that are considered herein are 3-dimensional (3D) structures that can be assembled using some type of connector or joint node, which correspond to nodes of the model, and connections between the joint nodes. The connections are described generally as tensegrity links which include compression links (struts) and tension links (cables). Compression links are strut type of connections that are used to support the compression forces that are present in the 3-D structure. Compression links may also support tension forces. Tension links are wire or cable type connections that are used to support the tension forces that are present in the 3-D Structure.

Any 3-D structure as considered herein can be assembled using only joint nodes and compression links, since the compression links can support both compression and tension forces. The main reason the tension links are considered in this type of 3-D structures is that the weight of the 3-D structure, that is the amount the material used, can be reduced substantially. A 3-D Structure has to support itself. If 3-D structures can be designed so that some compression links are replaced with tension links, larger structures can be assembled at a lower cost. By using this approach the price of material used for assembling and also the work involved in moving the assembling parts may be lower. One possible disadvantage is that the joint nodes have to be more complex in order to be connected to both compression links and tension links and the assembly process itself can be more complicated.

A 3-D structure may be a complex structure comprised of a large number of components, namely joints nodes and tensegrity links. The complexity of the 3-D structure can arise from using a number of unique components. The assembly and construction of a 3-D structure that uses a number of unique components is complicated due to the unique nature of all of the components, which requires the correct unique joint nodes be connected to other specific and unique joint nodes using specific tensegrity links.

The complexity of the 3-D structure may also arise from using a large number of joint nodes, which all have a similar structure, connected by similar tensegrity links. That is, a complex 3-D structure may comprise a large number of simple components connected together.

Figure 1B:
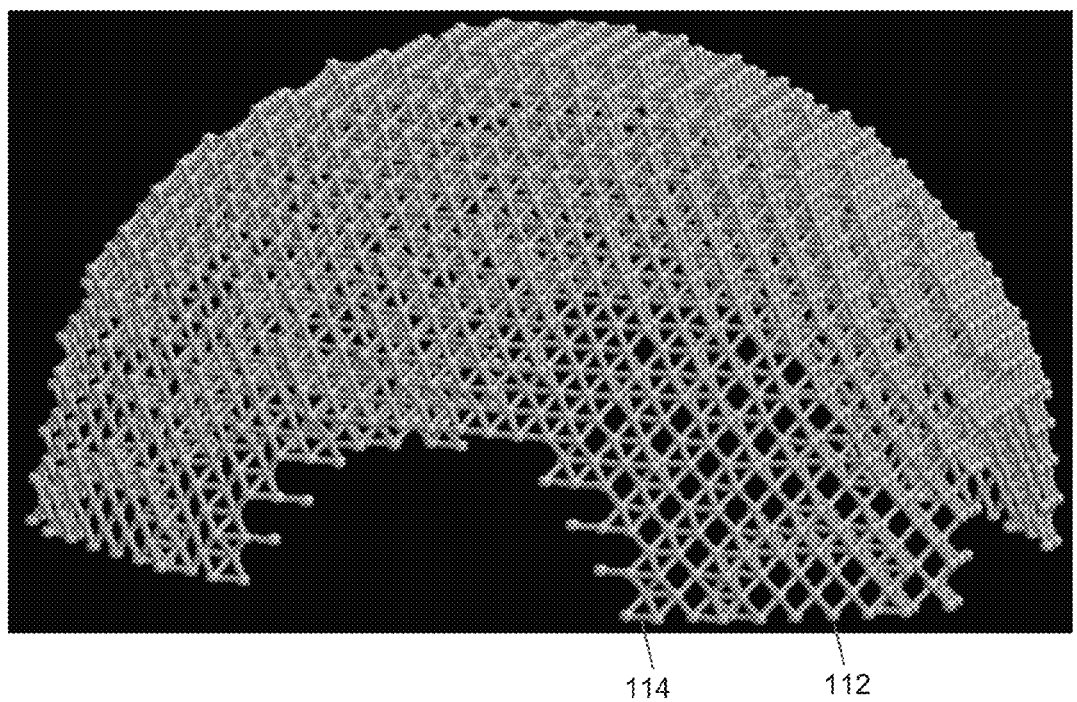
FIG. 1b depicts a further example of a complex structure.
Figure 1C:
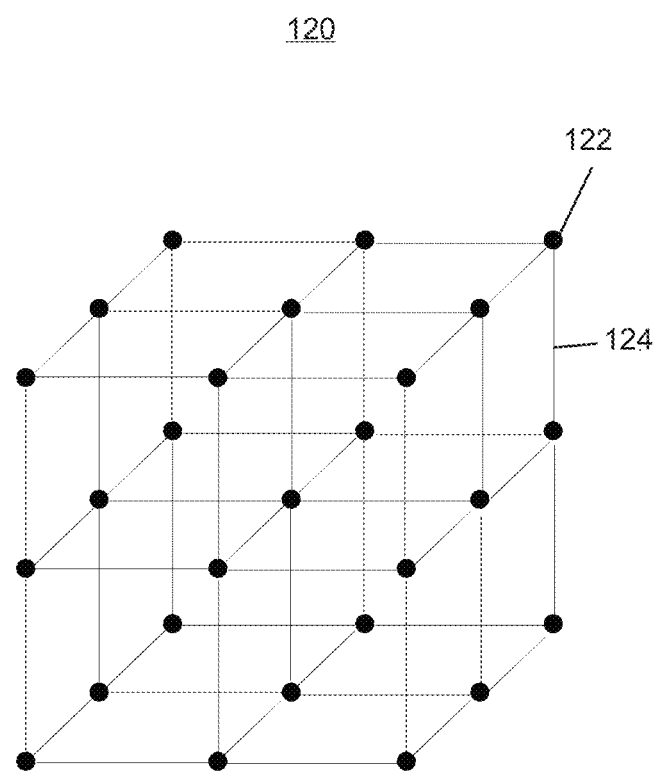
FIG. 1c depicts a further example of a complex structure.

FIGS. 1A-1C depict different 3-D complex structures. FIG. 1A depicts a triangular pyramid. The triangular pyramid structure 100 may be comprised of a small number of similar junction nodes 102 connected together by similar tensegrity links 104. The pyramid structure 100 is made of a repeating structure. The pyramid structure 100 is depicted as having a connected interior. The triangular pyramid structure 100 may be of varying size, from a small structure having molecular sized nodes, to a large structure such as a building or frame of a building.

FIG. 1B depicts a partially completed dome. The dome structure 110 comprises a small number of similar junction nodes 112 connected together by similar tensegrity links 114. The dome structure 110 may be of varying size, from a small structure having molecular sized nodes, to a large structure such as a dome covering a football field, building or other large area.

FIG. 1C depicts a rectangular structure 120. The rectangular structure 120 may be comprised of a small number of similar junction nodes 122 connected together by similar tensegrity links 124. The rectangular structure 120 may be of varying size, from a small structure having molecular sized nodes, to a large structure such as a large scaffolding. Scaffolding may be used when constructing or restoring other structures and may be a large and complex structure made from a small number of types of joint connectors.

From a geometrical point of view, a joint node may be characterized by the maximum number of connections that it supports and the spatial configurations or orientations of these connections. A tensegrity link may be characterized by its length. The complex structure may be assembled using only one type of junction node and only one type and length of tensegrity links. It is contemplated that a complex structure may be assembled using more than one type of junction node and length of tensegrity links; however, as considered herein, the number of different types of junction nodes used in the complex structure is much less than the total number of junction nodes used in the complex structure. Similarly, the length of the tensegrity links may be selected from a number of different lengths that is less than the total number of tensegrity links in the complex structure.

For a given joint node, the maximum number of connections and their spatial configuration, that is the location and orientation, will determine a repeating lattice structure of the final 3-D structure. As an example, consider a cubic joint node; the maximum number of connections for this type of joint node is six, one on each face of the cubic joint node. The orientation of the connections are aligned with the orientation of the three orthogonal axes of a cube. These cubic joint nodes will impose a three-dimensional discrete cubic lattice. This three-dimensional cubic lattice is in fact composed by a set of two-dimension discrete square lattices, overlapping perfectly on top of each other in separate planes. These planes are identical and equidistant. The distance between two different planes in the three-dimensional cubic lattice is identical with the distance between two joint nodes on any given two-dimensional square lattice.

As a further example of different types of joint nodes, consider a rhombic dodecahedron type joint node. The maximum number of connections for this type of joint node is twelve. The orientation of the connections are aligned with the orientation of the normal of the surfaces that determine a rhombic dodecahedron. These types of joint nodes will impose a 3-D discrete rhombic dodecahedron type lattice that is identical with a lattice generated by the close packing of spheres. This 3-D rhombic dodecahedron lattice can be imagined as being, composed by two types of lattices. The first type of lattices comprises a set of two-dimension discrete square lattices, shifted in such a way that the junction nodes of the square lattice of a current plane are exactly above the center of the cells of the previous square lattice. Again, these planes are identical and equidistant. The distance between two neighbouring planes in the three-dimensional rhombic dodecahedron type lattice is equal to the height of a corresponding equilateral square pyramid. The second type of lattices of the rhombic dodecahedron comprises a set of two-dimensional discrete triangle lattices, shifted in such a way that the junction nodes of the triagonal lattice of the current plane are exactly above the center of the cells of the previous plane. The distance between two adjacent planes in this case is equal with the height of the corresponding regular tetrahedron or regular equilateral triangular pyramid.

A cube-octahedron, shows that a square lattice and a triangular lattice, can be expressed in terms of each other. To each square lattice there corresponds a triangular lattice that is rotated by an angle equal with the angle between the normal of two adjacent faces of the cube-octahedron. As a result of this correspondence, any complex structure that is defined in a three-dimensional rhombic dodecahedron lattice can be assembled using planes with square lattices or using the corresponding planes with triangular lattices.

The 3-D space of a complex structure can be imagined as being an empty spatial lattice, that is empty nodes connected by empty links. The complex structure can then be imagined as being a subset of the spatial lattice which contains joint nodes connected by links. Each joint node of the complex structure corresponds to a populated node of the spatial lattice. Each tensegrity link of the complex structure corresponds to a populated link in the empty spatial lattice. With this construct it is possible to construct a model of the complex structure as a three dimensional array with all elements, or nodes, equal to zero, except for those nodes and links corresponding to joint nodes and tensegrity links of the physical complex structure.

Each node of the model corresponds to a joint node within the physical structure. Each node within the model may comprise information about the particular node, such as the type of node it is, the type and length of links connecting it to other nodes, and the other nodes it is connected to. For example, one value may encode the type of connections that define that node. For example in a dodecahedron type lattice a node can have a maximum of 12 connections. The values of the nodes can be any number between 1 and $2^{12}=4096$ encoding which of the 12 connections are present.

As described further herein, each node within the model may also be associated with a non-unique number that is used in identifying the location within the complex structure. Each joint node of the complex structure includes information encoding the non-unique number of the corresponding node in the 3-D model. The non-unique numbers of each node in the model may be assigned from a pseudorandom sequence or array as described further herein.

A pseudorandom sequence is a sequence of non-unique values that has a plurality of unique subsequences. That is, the sequence of non-unique values is such that a subsequence of some length less than the total sequence length is unique. As described further herein pseudorandom sequences can be used to encode nodes of a model of a complex structure. By capturing a group of the non-unique values encoded on the joint nodes of the physical complex structure corresponding to the model, it is possible to locate a corresponding group of non-unique values associated with nodes of the model. By locating the corresponding group of non-unique values within the model, a corresponding location within the complex structure can be determined. With the location within the complex structure determined, it is possible to provide further information, such as further construction or assembly steps required at the particular location.

As described further below, there are various types of pseudorandom sequences that can be used to encode positional information onto nodes of an array of nodes representing a complex physical structure.

1-D Pseudorandom Encoding

Pseudorandom Binary Sequences (PRBS).

Figures 2, 3:
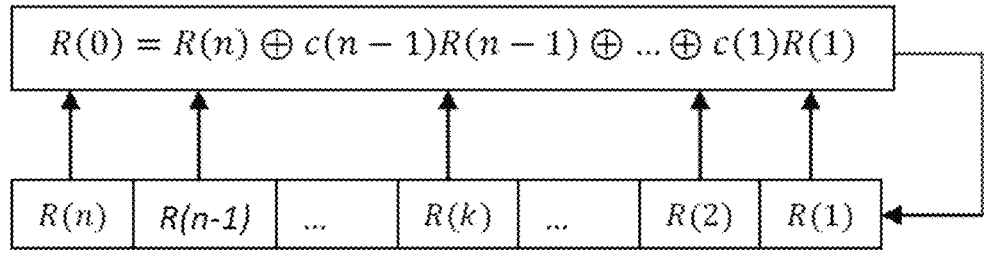
FIG. 2 depicts a module-two direct-feedback shift register.
FIG. 3 depicts generating polynomials for pseudorandom binary sequences.

A line or an axis can be encoded with one bit per quantization step along the line or axis using terms of a PRBS given by $\{S(p)/p=0, 1, \ldots 2^n-2\}$ generated by a modulo-two n-bit shift register as shown in FIG. 2, having the direct-feedback equations given in FIG. 3.

Recovery of the absolute 1-D position index, that is the index of the position within the sequence, is based on the PRBS window property. According to this, any n-tuples $\{S(p+n-k)/k=n, \ldots, 1\}\}$ scanned by a window $\{x(k)/k=n, \ldots, 1\}$ is unique and fully identifies the current index "p" of the window. The index of the window gives the starting position of the window within the sequence. A translation from the pseudorandom binary code to the natural index based encoding can be used to determine the position of the window on the encoded line or axis. That is, it is possible to determine a physical location if a correspondence between the elements of the pseudorandom sequence and the physical world is known.

Pseudorandom Multi-Valued Sequences (PRMVS)

A more compact encoding can be obtained by using PRMVS, where sequence elements are entries taken from a symbol alphabet with more than two symbols.

Compared to the binary approach, the resulting size of the window on the encoded line or axis having the same resolution of quantization steps for a PRBS decreases proportionally with the size of the symbol alphabet used.

A PRMVS has multi-valued entries taken from an alphabet of 'q' symbols, where q is a prime or a power of a prime. Such a $(q^n-1)$-term sequence may be generated by an n-position shift register with a feedback path specified by a primitive polynomial $h(x)=x^n+h_{n-1}x^{n-1}+\ldots h_1 \times h_0$ of degree n with coefficients from the Galois field GF(q).

When q is prime, the integers modulo-q form the Galois field $GF(q)=\{0, 1, 2, \ldots, p-1\}$ in which the addition, subtraction, multiplication and division are carried out modulo-q. When q is a power of a prime, $q=p^m$, the integers modulo-q do not form a field and the Galois field elements are expressed as the first q-1 powers of some primitive element, labelled for convenience by the letter A: $GF(q)=\{0, 1, A, A^2, \ldots, A^{q-2}\}$ The primitive polynomials used for different PRMVS generation depend on the nature of the addition/subtraction and multiplication/division tables adopted for each particular Galois field. The primitive polynomials over GF(q) can be easily found. It should be obvious that the PRBS is a particular case of PRMVS for $GF(2)=\{0, 1\}$.

According to the PRMVS window property any q-valued contents observed through a window of size n sliding over the PRMVS is unique and fully identifies the current position of the window.

For example, a two stage shift register, n=2, having the feedback defined by the primitive polynomial $h(x)=x^2+x+A$ over $GF(4)=\{0, 1, A, A^2\}$ with $A^2+A+1=0$ and $A^3=1$, generates the 15-term PRMVS: $\{0, 1, 1, A^2, 1, 0, A, A, 1, A, A^2, A^2, A, A^2\}$. Any 2-tuple seen through a 2-position window sliding over this sequence is unique.

2-D Pseudorandom Encoding

Pseudorandom Binary Arrays (PRBA)

In the case of a 2-D array or grid, the nodes are encoded (one bit per quantization step) with the elements of a PRBA. Such an $n_1$-by-$n_2$ array can be obtained by folding a $2^n-1$ term pseudorandom binary sequence $\{S(p)/p=0, 1, \ldots, 2^n-2\}$ generated by a modulo-two n-bit shift register.

The folding is done in such a way that the pseudorandom sequence follows a closed line on a torus. The pseudorandom array is then obtained by unfolding the torus to a plane surface. The following relationships hold for this PRBA:

$$2^n - 1 = 2^{k_1 k_2} - 1$$
$$n_1 = 2^{k_1} - 1$$
$$n_2 = \frac{2^n - 1}{n_1}$$

Where $n_1$ and $n_2$ must be relatively prime.

A 2-D coordinate recovery is possible based on the PRBA window property. According to this property any $k_1$-by $k_2$ nonzero binary pattern seen through a $k_1$-by $k_2$ window sliding over the array is unique and can be used for finding the window's coordinates (i,j) within the PRBA.

FIG. 4 shows the pseudorandom window property for a 15×17 PRBA 400 folded from a 255-bit sequence generated by an n=8 bit shift register. The pseudorandom binary pattern seen through a 4-by-2 window 402 sliding over this array is unique and can be used to identify the window's absolute coordinates (i 404, j 406), which in turn can be related to a physical location in a physical structure.

Pseudorandom Multi-Valued Arrays (PRMVA)

In this case of an array or grid of nodes, they may be encoded with non-unique elements of a pseudorandom multi-valued sequence (PRMVS). Such an array can be obtained by folding a $2^n-1$ term pseudorandom multi-value sequence using the same procedure described above for folding a PRBS.

Pseudorandom Product Array Encoding (PRPA)

The nodes of an array or grid can be encoded with the elements of a $(2^{k_1}-1)$-by-$(2^{k_1}-1)$ PRPA according to (see FIG. 5):

$$\{A(i,j)=X(i) \otimes X(j), i=0,1, \ldots 2^{k_1}-2, j=0,1, \ldots 2^{k_2}-2\}$$

Where X(i) are elements of a PRS (binary or multi-value) and X(j) are also elements of a PRS (binary or multi-value).

A "product operator" is depicted in FIG. 6. The set of symbols that encode the "product operator" is completely determined by all possible combinations of the values of X and Y taken as a couple—both, the composition and the order of the elements matter.

Due to the non-commutative character of this operator, it is always possible to recover the binary values of the two factors X(i) and Y(j) from the quaternary value of any A(i,j) product.

The quaternary pattern:

$$\{A(k,m)=X(k)\otimes Y(m)/k=i, i+1, \ldots i+k_1-1); m=j, j+1, \ldots, j+k_2-1\}$$

seen through a $k_1$-by-$k_2$ window sliding over the array is the product of the $k_1$-tuple $\{X(k)|k=i, i+1, \ldots, i+k_1-1\}$ and $k_2$-tuple $\{Y(m)|m=j, j+1, \ldots, j+k_2-1\}$.

$k_1$-by-$k_2$ Any rectangle of dimension $k_1$-by-$k_2$ in the pseudorandom array which contains a valid symbol on each line and on each column will constitute a window. From a window, it is possible to find, using the "product law" of the product operator depicted in FIG. 6, the binary values of all the elements of the 1-D pseudorandom patterns $\{X(k)|k=i, i+1, \ldots, i+k_1-1\}$ and $\{Y(m)|m=j, j+1, \ldots, j+k_2-1\}$ which fully identify the coordinates (i,j) of the 2-D window.

Figure 7:
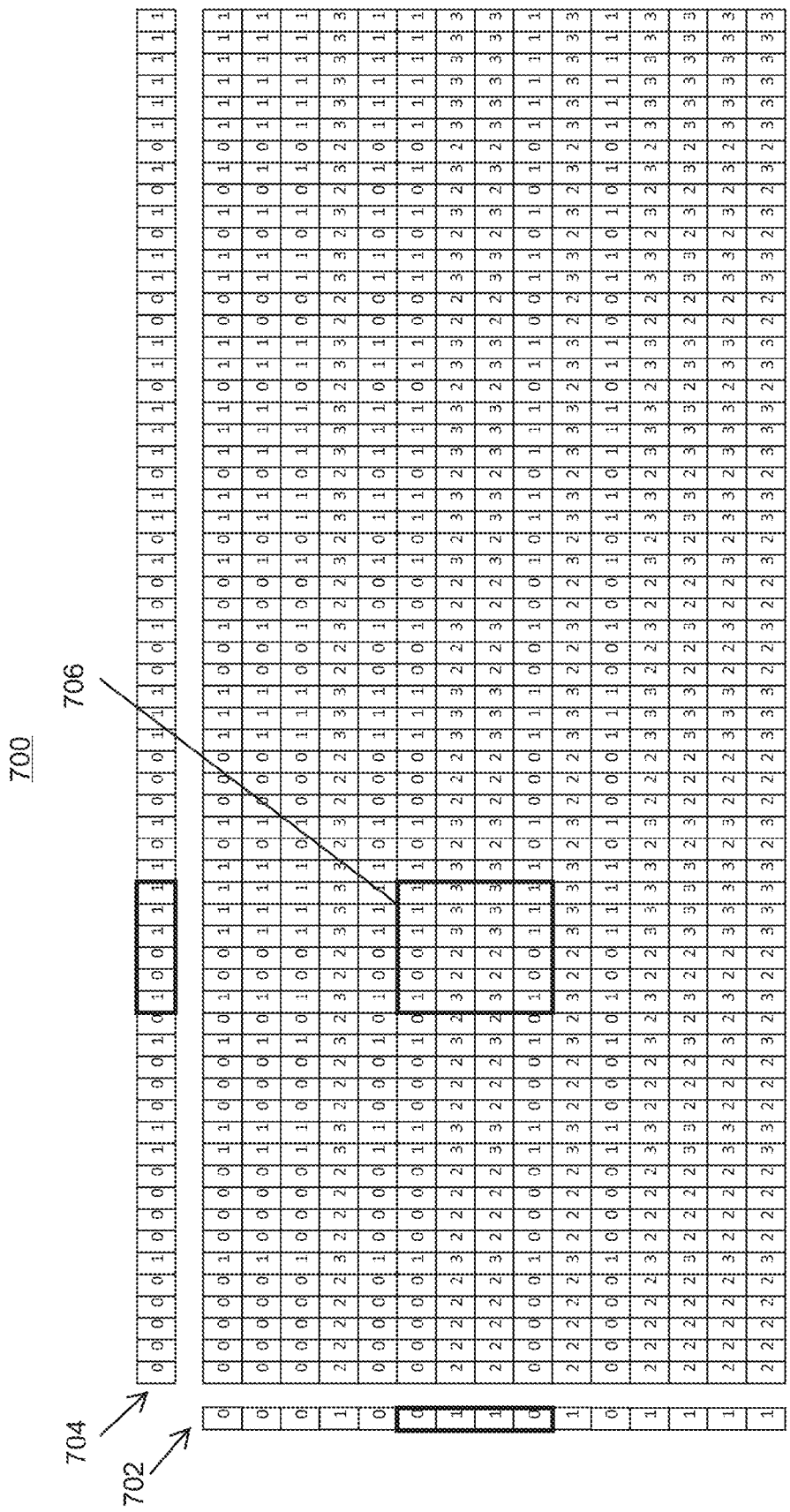
FIG. 7 depicts a pseudorandom product array and associated window

FIG. 7 shows as an example, the 15-by-63 quaternary PRPA 700. The X-axis' pseudorandom binary sequence 702 is defined by $h_1(x)=x^2+x+1$ over GF(2) and has a length equal with 15. The Y-axis' pseudorandom binary sequence 704 is defined by $h_2(x)=x^6+x+1$ over GF(2) and has a length equal with 63. Any 4-by-6 window ($k_1=4$, $k_2=6$) sliding over this array is unique and may be used to identify the window's coordinates. For the window 706 identified in FIG. 7, i=18 and j=6. The location of a pseudorandom window can be determined if the pseudorandom window contains a valid recognized symbol on each line and on each column. The top left symbol of the rectangle W(i,j) is the origin of the window, even if this symbol is not a valid symbol for a particular case.

3-D Pseudorandom Encoding

Pseudorandom Product 3-D Space Encoding (PRP3DS)

Nodes of a 3-D array or grid can be encoded with the non-unique elements of an $n_1$-by-$n_2$-by-$n_3$ 3-D pseudorandom array and can be obtained using the extension of the method presented in the PRPA section, but using three initial pseudorandom sequences and the corresponding three factor product law. Each sequence is used to encode one of the three axes. Each node in the 3-D array can be uniquely identified by three coordinates, one for each axis, that can be decoded following the same pseudorandom windowing property described above and extended to the three dimensional space.

Due to the non-commutative character of the product operator it is possible to recover the values of the three factors X(i), Y(j) and Z(k) from the value of any B(i, j, k) product.

The quaternary pattern:

$$\{(B(l,m,n)=X(l)\otimes Y(m)\otimes Z(n)\}$$

with:
l=i, i+1, \ldots i+k_1-1);
m=j, j+1, \ldots, j+k_2-1;
n=k, k+1, \ldots, k+k_2-1.

seen through a $k_1$-by-$k_2$-by-$k_3$ window sliding over the array is the product of the $k_1$-tuple $\{X(l)|l=i, i+1, \ldots, i+k_1-1\}$, $\{Y(m)|m=j, j+1, \ldots, j+k_2-1\}$, and $k_3$-triplets $\{Z(n)|n=k, k+1, \ldots, k+k_2-1\}$.

If a $k_1$-by-$k_2$-by-$k_3$ window is recovered, then is possible to find, using the corresponding product law, the values of all the elements of the 1-D pseudorandom patterns: $\{X(l)|l=i, i+1, \ldots, i+k_1-1\}$, $\{Y(m)|m=j, j+1, \ldots, j+k_2-1\}$ and $\{Z(n)|n=k, k+1, \ldots, k+k_3-1\}$ which fully identify the coordinates (i, j, k) of the 3-D window.

As described above, a 3-D physical structure can be constructed using a plurality of similar joint nodes and tensegrity links. If the nodes of the physical structure are encoded based on a pseudorandom sequence or array, it is possible to determine a location within the physical structure using the windowing property of pseudorandom sequence or array applied to a correspondingly encoded model of the physical structure. That is, if the nodes of a complex structure encode a pseudorandom sequence or array, a location within the complex structure can be determined by capturing a portion of the encoded pseudorandom sequence of adjacent nodes in the 3-D structure. The captured portion of the pseudorandom sequence may be used to form a window and the location of the window within the pseudorandom sequence encoded onto the model can be determined. The location within the complex physical structure may then be determined from the location of the window within the model of the structure.

As described above, a complex structure may be composed of a plurality of similar types of nodes connected together. The complex structure may be represented by a corresponding model comprising a 3-D array of elements representing nodes of the structure. It is noted that some nodes within the 3-D array may be empty nodes if the complex structure is not present at the corresponding location. The nodes of the model may be assigned a non-unique value from a pseudorandom sequence or array. Since the pseudorandom sequence or array comprises a plurality of unique subsequences, given a subsequence of an appropriate size, the location of the matching subsequence within the model can be located. As such, it is possible to determine a location within a complex structure by capturing a subsequence of the pseudorandom sequence encoded onto joint nodes of the complex structure and locating the matching subsequence within the pseudorandom sequence of the nodes of the model.

Figure 8:
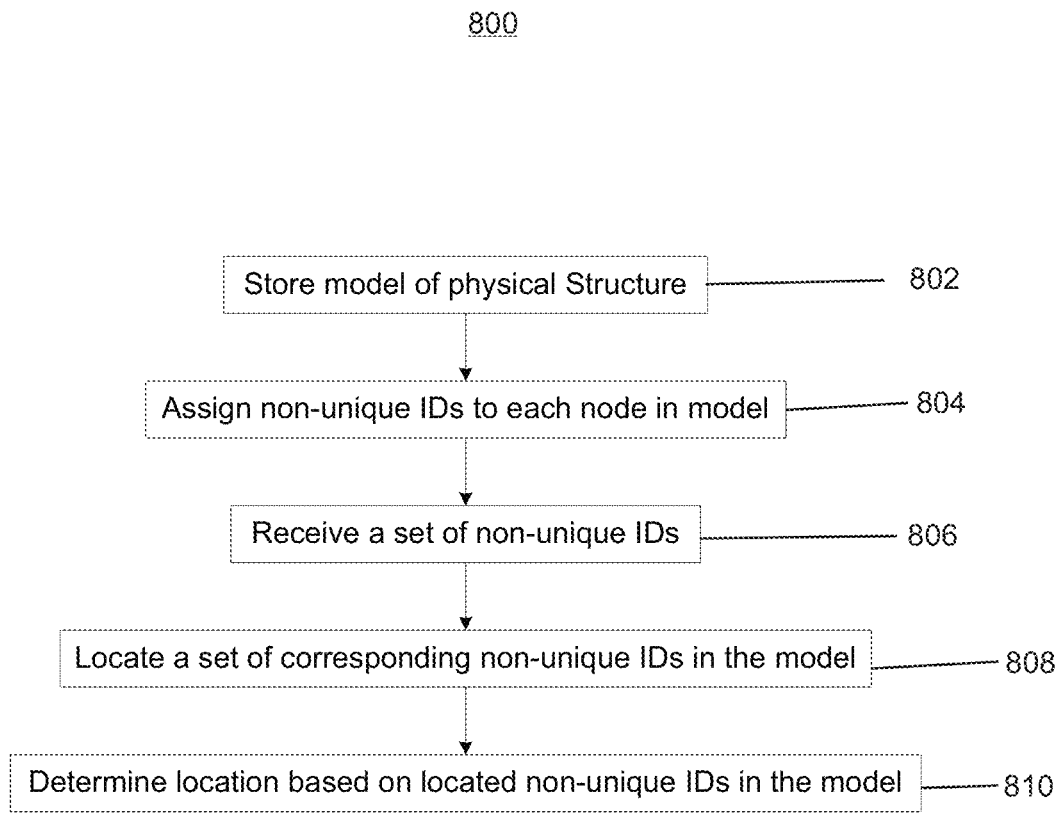
FIG. 8 depicts a method of determining a location within a complex structure.

FIG. 8 depicts a method of determining a location within a complex structure. The determined location may be used for various reasons, including for example providing further assembly instructions for assembling a complex physical structure. The method 800 begins with storing a model of the physical structure (802). The model may be stored in various structures; however, the model represents the physical structure as a 3-D array or grid of elements. The 3-D array comprises a plurality of elements. Each element in the 3-D array may be either an empty element, indicating that there is no corresponding joint node in the physical structure, or a populated element indicating that there is a corresponding joint node in the physical structure. The method 800 further comprises assigning non-unique identifiers to each element in the 3-D array (804). Regardless of the type of element in the 3-D array, the element includes a non-unique value assigned from a pseudorandom sequence. As described above, although comprised of non-unique identifiers, the pseudorandom sequence assigned to the nodes of the model comprises unique subsequences or arrays, allowing a location of a particular sequence of non-unique identifiers to be determined. The joint nodes of the physical structure are encoded with the non-unique identifiers of the corresponding element of the model. As described further, the non-unique identifiers may be encoded in various ways depending on the number of non-unique values. Once the model is created, a set of non-unique identifiers from the joint nodes of the physical structure are received (806). The non-unique identifiers may be received in various ways. For example, a worker constructing the complex structure could input the set based on the nodes within their view. Additionally or alternatively, the set of non-unique identifiers could be captured from a sensor, such as a camera and the information decoded from the photograph. As an example, the non-unique identifiers may be encoded using different colored nodes, so for example, a black node represents a non-unique identifier of 0 and a white node represents a non-unique identifier of 1. An image of a set of nodes may then be processed to identify the color of the nodes and so the non-unique identifiers of the nodes. A window is created from the set of non-unique IDs. The window may be created by arranging the non-unique identifiers in a grid or array corresponding to the location of each node in the physical structure. The specific orientation of the elements of the window may be determined using additional information encoded onto each node. For example each node may include information that is useful for determining a top corner of the node, which may be useful in determining the orientation of elements within the window. Once the window is constructed, it is used to locate a corresponding window of values within pseudorandom sequence of the nodes of the model (808). Once the location of the window within the model is determined, a location in the physical structure can be determined corresponding to the location in the model (810).

Figure 9:
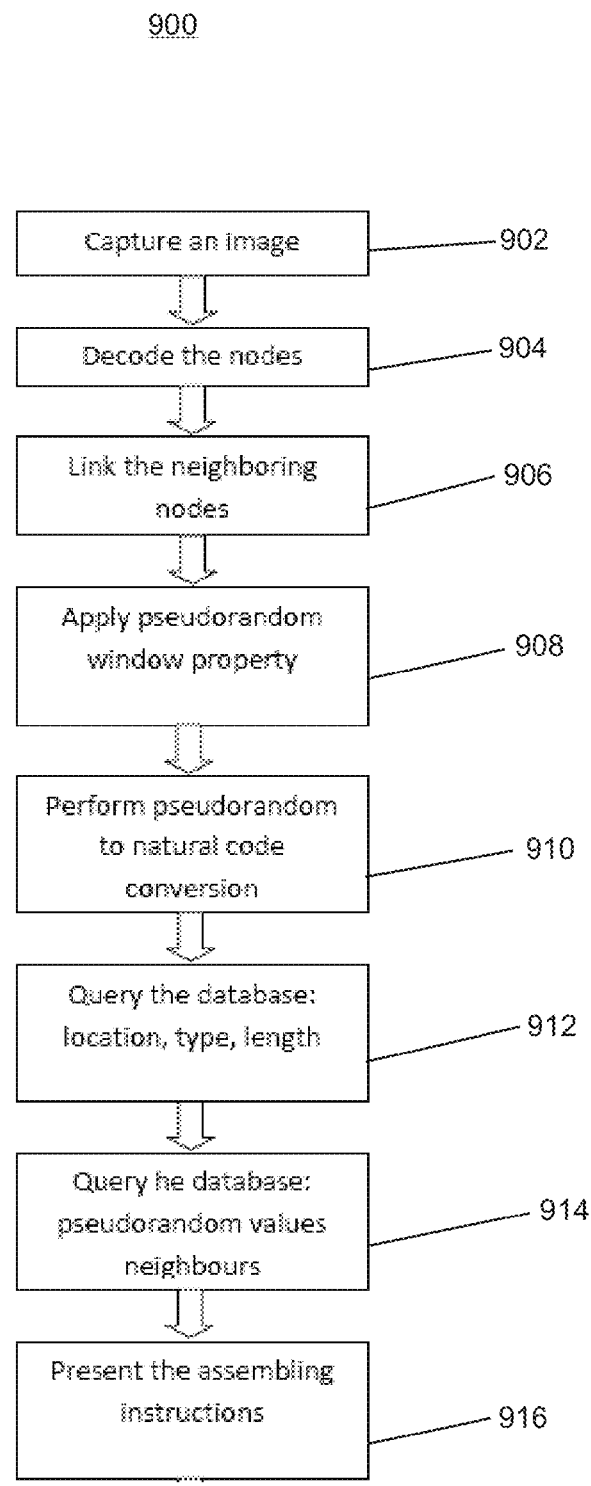
FIG. 9 depicts a method of assembling a complex structure.

FIG. 9 depicts a method of assembling a complex structure. The method 900 is assumed to use a visual encoding of the physical joint nodes, which are captured using an image capture device. The method 900 begins with capturing an image of a sufficient number of connected joint nodes from an area of an already assembled portion of the physical structure (902). Using image recognition techniques, the method decodes the encoded information in the nodes in the captured image (904). The shape, color and/or marking of the joint nodes may encode the pseudorandom value of the joint node. In a simple case, if a PRBA is used, the joint nodes can be encoded using two different colors. Once the non-unique identifiers are determined, the method constructs a window of the pseudorandom sequence of the array corresponding to the decoded values from the processed image. The window is constructed by linking the recognized values of the joint nodes with their neighbors (906). With the window constructed, the method applies the pseudorandom window property to locate a corresponding window of the model (908). With the corresponding window located in the pseudorandom sequence, a pseudorandom to natural code conversion is used to recover the location of the pseudorandom window within the 3-D array of the model (910). The window location within the 3-D array is used as a key to query a complex structure database; it uniquely identifies the location of the pseudorandom window in the 3-D array model of the physical structure to be assembled. The method 900 queries the database and extracts the location, the type and the length of the connections of the corresponding junction nodes and their neighbors' in the physical structure to be assembled (912). The neighboring nodes may belong to the plane under investigation, as well as to the neighboring planes. The method also queries the database and extracts the pseudorandom values of the neighboring joint nodes (914). With the information of neighboring joint nodes extracted from the database, the method can determine and present further assembling instructions (916) for connecting the neighboring joint nodes to the existing physical structure. It may be desirable that the information is presented in a very easy to understand fashion—using 3-D visualization and modeling.

With the assembly information presented, an assembly technician may assemble the struts and joint nodes corresponding to the information extracted from the database. The tendons, or cables are also assembled, if required, corresponding to the information extracted from the database. The joint nodes are also encoded with the associated non-unique identifier of the associated node of the model. The joint nodes selected for the assembly may be pre-encoded with the appropriate non-unique value, or alternatively, the non-unique value of the pseudorandom sequence can be provided on the joint node after its assembly.

Figure 10:
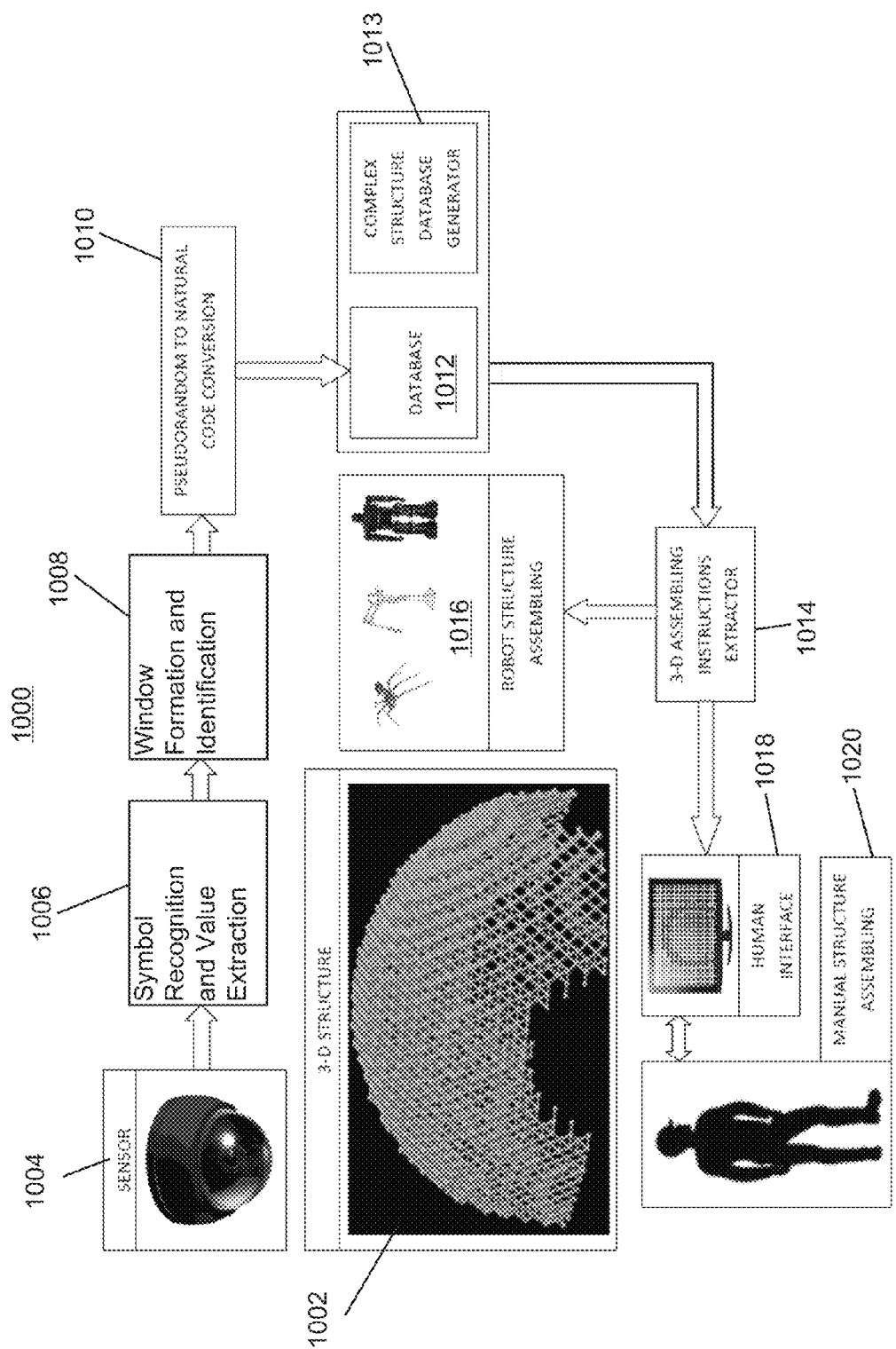
FIG. 10 depicts a process of assembling a complex structure.

FIG. 10 depicts a process of assembling a complex structure using pseudorandom sequences. The complex structure being assembled is considered to be a large domed scaffolding, although other complex structures are possible. For the sake of simplicity, the scaffolding is assumed to be constructed from a plurality of joint nodes connected together by a plurality of tensegrity links. Additional scaffolding components may be connected to or suspended from the joint nodes or tensegrity links. For example, the additional components may comprise flooring, ladders, handrails or other components. As will be appreciated, the constructed scaffolding has a repeating pattern. As such, it is necessary to know a position within the scaffolding in order to construct it properly. As an example, if the first level of the scaffolding is composed of 100 connected joint nodes, it is necessary to know how many joint nodes have already been assembled in order to assemble the scaffolding correctly. Further, due to the repeating nature of the assembly components, it is difficult to determine a location within the overall structure based on the surrounding components. For example, if stairs are to be placed at the $50^{th}$ joint node, it is desirable to know when 50 joints have been assembled so the stairs can be placed in the correct position. However, due to the repetitive structure, it is difficult to determine the location of the $50^{th}$ joint node. If each of the joint nodes has encoded information from a pseudorandom sequence, it is possible to determine a location within the structure using the windowing property of pseudorandom sequences, by simply capturing the encoded information on the joint nodes in the vicinity.

Using the process as described further with reference to FIG. 10, a next step in the assembly process of the scaffolding 3-D structure 1002 can be determined. As described above, each joint node is encoded with a non-unique value according to a pseudorandom sequence. Further, a computer system may store a model of the complete 3-D array structure that includes elements or nodes that either represent an empty location in the spatial lattice, or represent a joint node in the physical structure connected by links. Each node in the 3-D array, whether it is an empty node or a populated node corresponding to nodes in the physical structure, includes a non-unique value based on a pseudorandom sequence. Each populated node of the model may also be associated with assembly instructions describing further assembly steps required at the respective node, or more particularly the corresponding joint node.

The process 1000 includes capturing a set of non-unique values encoded onto the joint nodes of the physical structure in the location being assembled. The values can be captured using various sensors 1004. For example, the sensor 1004 may comprise an image capture device that captures a plurality of surrounding nodes. The joint nodes may be encoded using various means, including visual means, such as symbols and/or colours, chemical means or magnetic means. The sensor captures the encoded values of a plurality of the nodes and the symbols, or other encoding means, of the joint nodes are recognized and the values extracted 1006. Once the encoded values are determined, they are formed into a window 1008. The windowing property of the pseudorandom sequence used to encode the model allows the location of the formed window to be determined in the model, and converts the pseudorandom window sequence to a natural code that can be used as an index to a node of the model 1010.

Once the index of the window is determined it can be used to retrieve from a database 1012 information on the complex physical structure 1012, including for example the next nodes to be connected and the links to connect them with. The information may also include an indication of the pseudorandom sequence value that the joint node should be encoded with. In addition to the model database 1012, a model generator 1013 may be provided for generating a model of a complex 3-D structure.

The retrieved information can be used to provide further assembling instructions 1014. The assembly instructions may be provided to one or more assembly robots 1016 capable of executing the assembly instructions. Additionally or alternatively the assembly instructions may be provided to a human readable interface 1018 and provided for manual assembly 1020 of the 3-D structure 1002.

As described above, joint nodes are encoded with non-unique values of a pseudorandom sequence. When a set of non-unique values of joint nodes are received, a window of the non-unique values is constructed. In order to construct the window, the orientation of the joint nodes should be known. The orientation information may be encoded by symbols used to encode the non-unique values or may be provided in other means including, for example by an orientation of the sensor used to capture the encoded values. The encoding of the nodes used in the assembling of the complex structure could be symmetric or non-symmetric. Using a non-symmetry encoding a unique direction can be determined from the captured symbols that will be used to orient the pseudorandom window and permit the decoding of its location. A perfectly symmetric encoding may be used, in which case the orientation may be determined by the direction of the sensor used to capture the "image" of an area of the portion of the structure already assembled.

The particular characteristics of the joint nodes and symbol encodings of the physical complex structure may be selected in such a way to meet the following requirements:

There is enough information at the node level to provide an indication of the array's orientation and about where neighboring nodes can be found;

There is a recognition method for the given characteristics of the nodes that is invariant to position and orientation of the nodes;

The nodes should have sufficient uniqueness so that other neighboring details won't be mistaken for encoding nodes.

Figure 11:
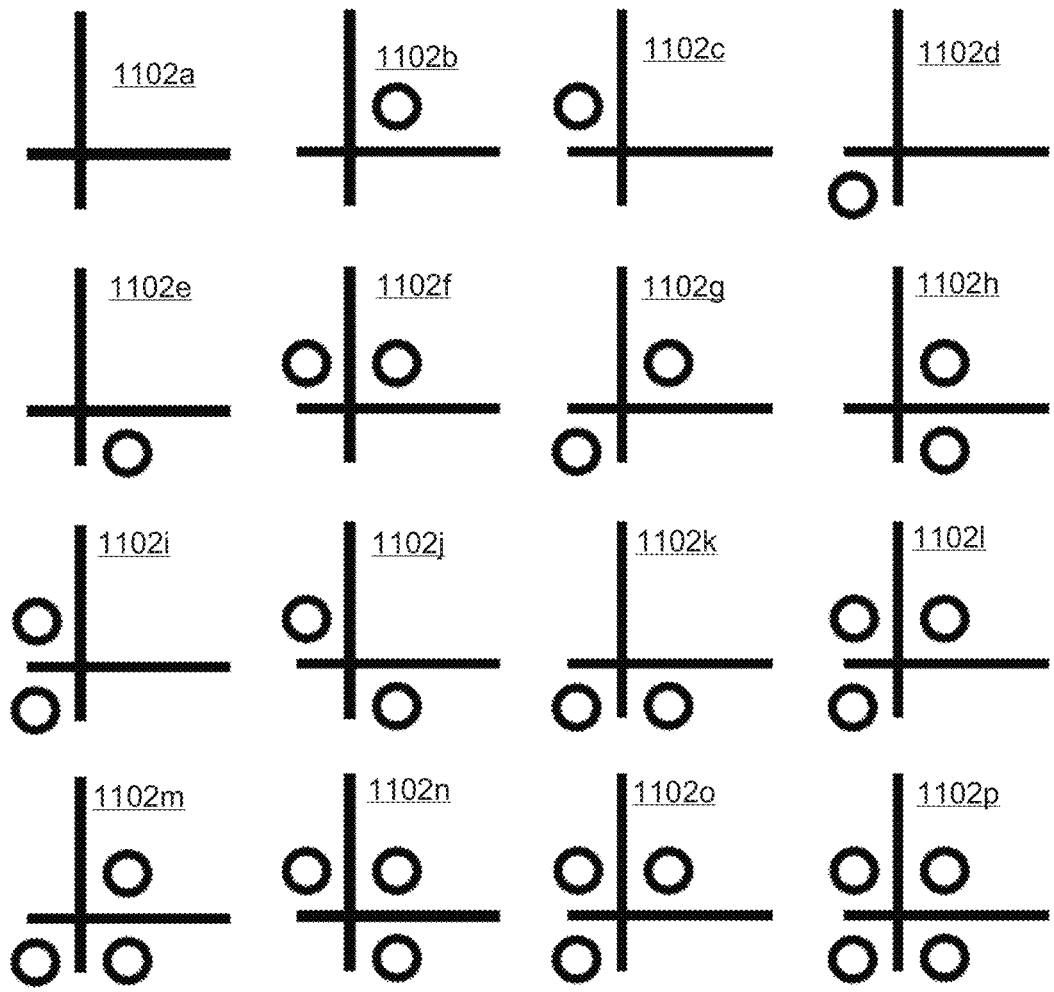
FIG. 11 depicts a set of possible symbols for encoding non-unique identifiers.
Figure 12:
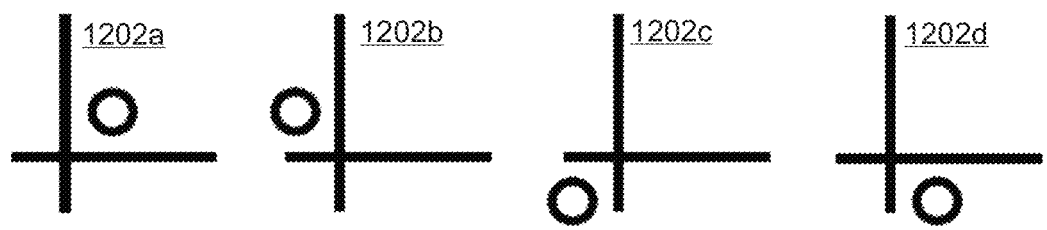
FIG. 12 depicts a subset of the symbols of FIG. 11.

The nodes can be encoded with their pseudorandom values using, for example:

Visual characteristics—each type of node is colored differently or they use patterns or marking to make them unique. Using a camera and image processing techniques the pseudorandom values can then be read (recognized). FIG. 11 and FIG. 12 show few possible sets of symbols and nodes that can be used for visual encoding;

Magnetic characteristics—the nodes are magnetized at different strength or under different orientation, or use multiple mini-magnets to encode specific patterns. Using some kind of magnetic head the values of the node can then be read and decoded;

Chemical—each type node can have a specific spectral signature. Using spectrum analysis the pseudorandom value can then be determined.

FIG. 11 depicts a set of possible symbols for visually encoding non-unique identifiers. FIG. 12 depicts a subset of the symbols of FIG. 11. As depicted in FIGS. 11 and 12, each encoding 1102*a-p* may encode a value, for example from 1 to 16 as well as orientation information. The orientation information may be encoded using the two intersecting lines to provide an indication of the orientation of respective axes of the node. The lengths of each line from the intersection point may provide an indication of a direction in each axis. As depicted in FIG. 12, only a subset of encodings 1202*a-d* selected from the possible encodings of FIG. 11 may be used to encode nodes, allowing the encodings to be more easily recognized.

As described above, a 3-D array model may be stored that corresponds to the physical structure. The model may be provided by a database that stores the information required in the assembling of the structure. The database may store the following attributes for each of the model's elements corresponding to the nodes of the complex structure:

The pseudorandom value of the node which is used for making the connection between the physical structure and the stored database model. After a pseudorandom window is identified on the physical structure, using the window property makes it possible to uniquely identify the elements in the pseudorandom array corresponding to the identified pseudorandom window;

The node type, which is determined by the number of links, the locations of these links and type of the connections (links) specific to each node. For example, in a rhombic dodecahedron type lattice each node can have up to 12 neighboring nodes. These 12 locations can generate up to 212 sets of links. In a cubic type lattice each node could have up to 6 neighbours;

The type and length of each link. Each link can be a strut or a tendon (cable);

The pseudorandom value of each of the neighbors. There is a one to one correspondence between the number of types of nodes and the number of symbols used to encode the pseudorandom values.

The above description has assumed that a portion of the physical structure is already assembled; however, assembly of the complex structure may start from a "base plane". The base plane may give initial stability and impose the length unit of the struts and tendons to be used. For example, for a cubic lattice, the base plane has a means of assembling struts and tendons normal to the plane, following a square lattice structure. For a rhombic dodecahedron lattice it is possible to start from a square lattice or a triangular lattice as described above. Again, the base plane shall have a means of supporting the assembling of struts at the required angle to permit the dodecahedron lattice.

The encoding of the pseudorandom array onto nodes of the model has been described above as being provided by a visual encoding, however other types of encodings are possible. The nodes of the complex structure could be passive nodes, for which the reading of the nodes may be done by a sensor using pattern recognition or an image processing type approach. Additionally or alternatively, the nodes of the complex structure could be active nodes, for which the nodes emit, or transmit, signals that encode their pseudorandom value.

Furthermore, the overall physical structure could be also be either passive or active. A passive structure has all passive nodes and an active structure comprises active nodes that "know" their locations and are capable of signaling all the required links to their neighbours.

Access to the database, and presentation of the retrieved information, can be provided in various ways. The database could be provided on a local stand-alone storage device with a display that presents to the user a given section of the structure based upon the provided pseudorandom window and/or the absolute indexes in the array. The database could be further accessed from a network storage device and a local display device that can present to the user a given section of the structure based upon the provided pseudorandom window and/or the absolute indexes in the array. Further still the database could provide the assembly instructions to a manipulator or assembly robot or human assembly technician.

The physical structure can be assembled using various methods of accessing the information in the database. Each and every region of the planes that define the given structure will provide the information regarding the corresponding links between nodes. A semi-automatic assembly allows the window to be entered manually by the operator and the search in the database and the returning of the information regarding the requested pseudorandom window is done automatically. The information, such as further assembly instructions, may then be presented to the operator for carrying out. An automatic assembly process allows the pseudorandom window to be automatically read and decoded by some sensor or sensors and a pseudorandom window recognition algorithm. The window may be used as the input into the search algorithm that will return the necessary information regarding the nodes and the links for the given pseudorandom array.

The assembling of the complex structure can be done in many different ways. For example, the assembling can be done manually by a human being; automatically by a robot, or a manipulator that can reach any node in the complex structure; automatically by an army of ant-robots (insect-robots) that applied, the method described above, independently of each other with each robot acting locally; or by a combination of any of these assembly methods.

The system could be self contained in a hand held type device including the sensor for capturing the encoded information from joint nodes, the processing; the database and a display for displaying assembly instructions or other information. Another possibility is to have the processing and the database stored on a central server. Once the sensor acquires an "image" of an area of the already assembled complex structure, the data is sent to the server. All processing required for various functionality is done on the server, including functionality for node recognition, pseudorandom window recovery, pseudorandom to natural code conversion, and database queries. The information extracted from the database could then be sent back to a handheld device of an operator.

Very big and complex structures can be grown. During the assembling of the final complex structure some nodes can be added just to support the structure and latter they can be removed and used in another section of the structure. As an example, one can imagine a dome, which nodes and links from the interior part are continually disassembled and reused in the assembled of the exterior part. Through this process, the dome increases its size. Of course, extra nodes and links are also needed during this type of assembling if the nodes that are disassembled are not enough to complete the complex structure.

The size and the strength of the material used to construct the nodes and the links (struts and tendons) may determine the size of the details of the structure and the overall strength of the structure.

As described above active nodes may be used to facilitate the assembling process. All nodes may be active, which may be a prohibitively expensive approach. Another approach is to use active shell nodes that can be designed to be placed on the existing nodes and which will signal what connections are possible. These active shell nodes can then be reused, reducing the number of active nodes required and so decreasing the associated cost.

The process of assembling a complex structure using shell active nodes may be described generally as follows.
1. Identify an area of the already assembled structure;
2. Install shell connectors on the exiting nodes;
3. Each shell connector identifies the value of the node it is installed on;
4. After enough shell connectors are installed send command to the shell connectors to start communication with each other;
5. Depending on the values of the shell connections determine the pseudorandom window that encode that portion of the array;
6. Consult the database and extract the connections of the corresponding nodes with their neighbors' in the 3-D structure to be assembled;
7. Make each shell node signal the connection corresponding to its present location;
8. Assemble the struts and nodes corresponding to the information provided.

Various methods of assembling a complex structure that make use of the method of determining a location within the complex structure are described further below.

Human Assembly Method Using Maps (HAMUM)

By closely analyzing a 3-D Structure assembled from joint nodes and tensegrity links (struts and tension links) one can see that the 3-D Structure can be divided into a large number of parallel planes stacked one on top of another. Each plane contains joint nodes and tensegrity links. Some tensegrity links connect the joints nodes belonging to the considered plane. Other tensegrity links connect the joints nodes of the plane under consideration with the neighbouring planes.

By decomposing the complex 3-D structure into a number of planes, the process of assembling the structure may become easier than having to assemble the structure following a random assembling sequence. Starting from a model of the complex structure stored in the database, it is possible to generate plane maps that show all the joint nodes of a plane and the connections between them inside a given plane and also the connection with the joint nodes of the neighbouring planes.

When assembling a complex structure using plane maps, a model of the completed 3-D structure may be provided or generated. If the 3-D structure to be assembled is not self-supported during the assembling process, it is possible to add components to the desired 3-D structure to allow the structure to be safely assembled. At any time during the assembly process the structure must have structural integrity and be self-supported. The plane maps can contain all the joint nodes and tensegrity links for the self supported version of the 3-D structure, which may differ from the completed 3-D structure if the 3-D structure is not self-supporting throughout the construction process. The plane maps may provide a distinction between the joints nodes and the tensegrity links that belong to the final 3-D Structure and the ones that have been added to the 3-D structure just to make it structurally sound during the assembling process.

Once the plane maps of the 3-D structure are generated, the assembly process may begin. Starting from a base plane, an operator can start assembling all the joints nodes and tensegrity links belonging to the base plane by reading the pseudorandom encoded nodes belonging to the first plane map. The nodes can be encoded using any type means of encoding as presented above. Once the nodes of the base plane are assembled according to the first plane map, the compression links from the base plane to the second plane, and/or to any higher plane may be connected according to the first plane map.

Once joint nodes and tensegrity links of the base plane are assembled, the joint nodes and tensegrity links of the second plane can be assembled according the second plane map. Any tension links from the second plane to the base plane, or lower plane may be connected once the joint nodes of the second plane are connected. The compression links from the second plane to any higher planes are assembled according to the second plane map.

The process of assembling a plane and connecting it to lower and upper planes according to an associated plane map is repeated for each remaining plane. Once all of the planes of the complex structure are assembled, it is possible to disassemble or remove all of the joint nodes and tensegrity links that were added to provide structural stability to the 3-D structure during the assembly process.

Human Assembly Computer Assisted Method (HACAM)

This method works by associating the 3-D structure to be assembled with a corresponding model that is created and stored in a database. The HACAM process provides information to assist a human operator, or operators, during the assembling process.

The human operator keeps the 3-D structure being assembled and the model of the structure in sync, that is the model maintains information on what portion or portions of the 3-D structure has already been assembled. The operator also ensures that the nodes of the 3-D complex structure each encode a non-unique identifier corresponding to a non-unique identifier of the corresponding element in the model. The non-unique identifiers are assigned to the elements of the model when the model is created.

At any time during the assembling process, and/or after the assembling is done, the database can be consulted to instruct the operator about the next step in the assembling process. The database may also be consulted to inspect the tensegrity links and the joint nodes of the assembled parts of the 3-D structure or the completed assembled 3-D structure to view information about each link or node.

To enable this assembling process, all the nodes of the 3-D structure are encoded with a non-unique identifier corresponding to a non-unique identifier assigned to the corresponding element in the model using one of the pseudorandom methods described above.

A 3-D structure may be assembled using a large number of tensegrity links and joints nodes. As described above, although the complex structure may comprise a large number of joint nodes and tensegrity links, each are selected from a limited number of different types of joint nodes or tensegrity links. A model of the complex structure is generated and stored by the assembling system.

To assemble the complex structure, the human operator should have access to assembling elements, namely joint nodes and tensegrity links. The joint nodes may be pre-encoded with non-unique pseudorandom symbols as presented above. The operator may be provided with a joint node reader, which includes a sensor that allows the non-unique symbols encoded on the joint nodes to be read and decoded by the assembling system. A model of the complex structure to be assembled is stored in a database and is accessed by the assembling system to provide further assembling instructions. The operator may also be provided with a base plane map describing a base on which the 3-D structure will be assembled, or a seed off of which the 3-D structure can be built. The base plane map, or the seed may be provided by the assembling system.

The following describes the steps in assembling a complex structure using the HACAM process.

The base plane or the seed of the 3-D structure is assembled using the process described above with reference to the Human Assembling Method Using Maps (HAMUM). The assembling system may be used to generate all of the plane maps of the 3-D structure. Once the base plane or seed is assembled, an image of the seed or base plane is captured and sent to the assembling system for processing. For each 3-D structure, a seed, which is a small number of assembled joint nodes connected together, or a base plane is defined and stored by the assembling system. An operator ma use the HAMUM method described above to manually assemble the initial seed or base plane.

Once the seed or the base plane is assembled, an assembly process is repeated until the 3-D structure is completed. The assembly process repeatedly captures an image of an area of the already assembled 3-d Structure and the assembling system determines what to do next. That is the assembling system determines what joint nodes should be connected next.

The assembling system will guide the operator, following the shortest path, from the current state of the 3-D Structure to the next. When determining the next assembly step, the assembling system applies image recognition techniques on the captured image that contains a sufficient number of connected nodes from an area of an already assembled portion of the structure. The image recognition technique decodes the nodes in the image. The shape, color and/or marking of the nodes encode the pseudorandom value of the node. In a simple case, if a PRBA is used, the pseudorandom value of the nodes can be encoded using different colors. Once the pseudorandom values of the nodes are decoded a window of the pseudorandom portion of the array corresponding to the recognized nodes values in the processed image is constructed by connecting the recognized values of the nodes with the values of their neighbors.

The process for determining the next assembly step comprises the operator capturing an image of a sufficient number of connected nodes from an area of an already assembled structure, including the base plane or the seed. Once the image is captured it is provided to the assembling system which identifies a pseudorandom window encoded on the captured nodes and applies the pseudorandom window property to locate a location of a corresponding unique subsequence within the pseudorandom sequence encoded on the nodes of the model. Once a corresponding subsequence or window is found, a pseudorandom to natural code conversion is applied to recover the location of the pseudorandom window within the model of the structure. The window location within the model may then be used as a key to query the complex structure database. With the location of the window located within the model, the database of the node elements of the model can be queried to extract information on the connections that need to be made to at the current location. The extracted information may comprise, the location, the type and the length of the connections of the corresponding nodes with their neighbors' in the 3-D complex structure being assembled. The neighboring nodes may belong to the current plane being assembled, as well as to the neighboring planes. The database is also queried to retrieve the pseudorandom values of the neighboring nodes. Once the information is retrieved from the database, it is presented to the operator. The information may be presented in a very easy to understand fashion, for example, using 3-D visualization and modeling. Once presented with the further assembly instructions, the operator assembles the struts and joint nodes as indicated. Once the joint nodes are connected, the operator may assemble any the tension links. Once the operator has completed the presented assembly steps, the database may be updated in order to track what portions of the 3-D structure have been assembled. If the assembly of the 3-D structure is completed, the process is complete. If, however, the assembly is not completed, the operator may capture another image of a plurality of nodes, and the assembly process described above may be repeated.

The assembling system may use graphical instructions to assist the human operator with the assembling of the 3-D Structure. Visual 3-D models can show, at any time, where the next assembly elements are and where to go to assemble the next one. Also voice instructions and/or text messages can be included for clarification and assistance at any time and at any step during the assembling process.

Robot Assembly Method (RAM)

This method takes the Human Assembling Computer Assisted Method (HACAM) and improves upon, by replacing the human operator with a robot, or a team of insect robots working together for the assembling of the complex 3-D structure. The process is similar to that described above with regards to the HACAM process, however instead of presenting assembly instructions to the operator, the assembly system directs robots to complete the next assembly steps. The robots communicate with, and are controlled by, the assembling system and follow the same assembling process that is used to instruct the human operator, operators, in the HACAM method.

The robots will capture images of the already assembled 3-D Structure. The information obtained from these images is used for two types of decisions. The first is to determine the position of the robots relative to the 3-D structure. By recognizing a pseudorandom window the assembling system can calculate the relative position of the robot from the position of the identified nodes using triangulation techniques. The second type of decision is to determine what assembly element, that is joint nodes and tensegrity links, has to be assembled next. The determination of the next assembly step to take is made by following the same type of logic as presented in the previous method (see HACAM).

There are at least two types of robots that can be used for the assembling of a 3-D structure. A robot arm, or robot arms, can be controlled to assemble the 3-D structure under control of the assembling system. The robot arm may be fixed or mobile. A mobile arm may move on the ground, or on assembled portions of the 3-D structure, to reach points of the 3-D Structure during the assembling process. A further type of robot that can be used during the assembly process may include an insect robot, or a team of insect robots, attached to the 3-D Structure and moving on the 3-D Structure while performing the assembling of the structure.

The use of a robot arm may be preferred for relatively small 3-D structures of low complexity. The robot arm has to be able to reach all points of the 3-D structure. The assembling system is able to control the robot arm to position it to the desired location.

The robot arm has enough degrees of freedom to allow the assembled elements to be read and the new ones to be added to the 3-D Structure at the desired location. As the 3-D structures becomes big and complex, at some point these tasks become difficult, or even impossible to be execute; the robot arm will not be able to reach some points of the 3-D structure due to the spatial limitations.

An insect robot, a small robot that can move using the 3-D Structure as its base, and can reach any point of the already assembled 3-D structure, may be the preferred solution for assembling larger or more complex 3-D structures. A "spider robot" will read the nodes of the already assembled portion of the 3-D structure in a particular area. This information can be used to determine the relative position and orientation of the spider robot. The assembling system may also use the captured node information to make a decision about the steps required to move the robot to a new location where new assembling elements have to be added to the 3-D structure. Once the spider robot arrives to the new position, the spider robot can assemble new elements according to the instructions determined by the assembling system. Two way communications between the assembling robots and the assembling system ensure that the assembling system knows at any time where the robot is, and what its configuration and functional state is. The two way communication also ensures that the assembling system knows of any new assembly element that is added to the 3-D structure so that the database can be updated accordingly.

The spider robot has the necessary capabilities for assembling the 3-D structure. These capabilities include the ability to attach itself to the 3-D Structure to be assembled or maintained and move from one point of the 3-D Structure to another when the intermediary assembly elements are in place and/or some are missing. Further, the spider robot is light enough to be able to move on the 3-D Structure without damaging it, while still being able to carry a load of assembly elements that will be used in the assembling of the 3-D Structure. The spider robot comprises a sensor that is able to read, or otherwise capture, the pseudorandom values of neighbouring nodes in order to determine its position and orientation. The spider robot may communicate the read pseudorandom values to the assembling system in order to keep the 3-D structure and the model of the structure in sync and to receive instructions about what to do next.

The spider robot may further report its position and the pseudorandom values of the neighbouring nodes to the assembling system as well as report its function state, such as a low battery state, or having no more assembly elements.

In order to begin the assembly process a human operator may start assembling a seed of the 3-D structure. Once the seed or base plane is assembled, a spider robot or robots may be placed on the seed or base plane to initialize the process. During initialization each spider robot attaches itself to the 3-D Structure and reads neighboring nodes of the assembling elements it has attached to. The spider robots request instructions from the assembling system. The assembling system instructs the robot to move, following the Shortest Path, from the current assembling element, the origin of the pseudorandom window that was just being read, to the location of the next assembling element to be assembled. The assembling system may check if there are still assembling elements available to the spider robot to use, and if there are not, the assembling system can instruct the spider robot to refill with the right combination of assembling elements required to perform the next steps in the assembling. If the spider robot has sufficient assembly elements to carry out the next assembly steps, the assembling system can instruct the spider robot to the next location.

Once the robot arrives at the specified location, the robot consults the assembling system for the next assembling element, for example the next tensegrity link or joint node, to be added to the 3-D structure, and adds the assembling element to the 3-D structure. The spider robot may then read an area of the neighbouring nodes to determine a pseudorandom window which can be sent to the assembling system. The assembling system may use the received information to keep the 3-D structure and the model of the 3-D structure in sync. This assembly process is repeated until the 3-D structure is completed.

Complex Structure Growing Method (CSGM) and Complex Structure Morphing Method (CSMM)

The Complex Structure Growing Method (CSGM) starts from a small version of the 3-D structure and grow a bigger one, while the Complex Structure Morphing method (CSMM) can morph an initial 3-D structure into a new one. Both of these methods use assembling elements that are no longer required in the initial 3-D structure and also add new assembling elements when required. It is contemplated that the Complex Structure Growing Method (CSGM) can be used in reverse, that is it starts from a bigger version of the 3-D structure and reduce its size. The method becomes the Complex Structure Shrinking Method (CSSM).

These methods are used in conjunction with two of the methods described above, namely HACAM and RAM. Instead of starting from a Seed (see HACAM and RAM), the growing or morphing process starts from an initial 3-D Structure that is fully assembled. Under the assembling system instructions, the human operator (for HACAM) or the robot (for RAM) will be instructed of the steps required for assembling and disassembling and reuse of the assembly elements. The growing/morphing algorithm can instruct the operator or the robot of the appropriate actions so that the 3-D structure remains structural intact. The assembling system can also instruct the operator or robot to add new elements where required to build the new 3-D Structure and remove assembly elements from the 3-D structure that are no longer required.

The growing/morphing algorithm can be optimized such that the transition of the 3-D structure from the initial state to the final one is done with a minimum number of steps. If needed, new features are added to the 3-D Structure to support the growing/morphing process. If a team of robots or a team of human operators is used, the assembling system ensures that the members of the teams do not interfere with each other and do not occupy the same region of the 3-D Structure at the same time, which may create too much stress on the 3-D structure.

The growing method may be a preferred building process for big structures that are very difficult or impossible to be assembled in only one iteration. For example imagine a big dome that can cover a large area. The best way to build such a structure is to start with a small version of the dome and grow it to the desired size using the Complex Structure Growing Method. One drawback is the amount of time and steps required to assemble the final structure can be large. If n iterations are required to grow the structure from the initial state, to the final one, the process is similar with assembling n structures and des-assembling n-1 structures of increasing sizes. An advantage is that once the structure has passed through at least one iteration, it can be used for the purpose it was designed for, while the growing process continues. Also, if a big team of robots do the work, the process can be shortened considerably.

Using these methods, building can be design that can have variable sizes and shapes that can change to accommodate different requirements and/or specifications. Imagine a' house that can become larger during the summer when there is no need for heating and smaller in winter when the owner wants to reduce the heating cost. During the transition process the house will remain totally safe and habitable.

Another good application of these methods is construction in space. Once a small space habitat has been build, it can be grown to accommodate new people and/or equipment, without putting in danger the life of the people inside.

What is claimed is:

1. A method of determining a location within a 3D physical structure comprising:
   storing a 3D model of the 3D physical structure comprising a plurality of nodes connected by a plurality of struts, each of the nodes and struts of the model corresponding to respective nodes and struts of the physical structure;
   assigning a non-unique identifier (ID) to each node of the model according to a pseudo-random sequence, wherein each node of the physical structure encodes the non-unique ID assigned to the corresponding node of the model;
   receiving a set of non-unique IDs encoded onto respective nodes of a contiguous subset of nodes of the physical structure;
   locating a set of non-unique IDs in the model corresponding to the received set of non-unique IDs; and
   determining a location in the physical structure from the located set of non-unique IDs in the model.

2. The method of claim 1, further comprising:
   decoding the received non-unique IDs;
   forming the decoded non-unique IDs into a window according to neighbouring nodes of the physical structure; and
   wherein locating the set of non-unique IDs in the model comprises matching the window of non-unique IDs to a model window of non-unique IDs of the model.

3. The method of claim 2, wherein locating the set of non-unique IDs provides a grid location of the window of non-unique IDs within a grid of the pseudo-random sequence.

4. The method of claim 3, wherein the grid location is used to determine the location in the physical structure.

5. The method of claim 2, wherein the non-unique IDs are visually encoded onto the nodes of the physical structure.

6. The method of claim 5, wherein the set of non-unique IDs of the physical structure are received in an image of the physical structure.

7. The method of claim 6, further comprising:
   identifying nodes in the received image; and
   decoding the visually encoded non-unique IDs of the identified nodes.

8. The method of claim 2, wherein the non-unique IDs are encoded onto the nodes of the physical structure using one or more of:
   magnetic encoding; and
   chemical characteristics.

9. The method of claim 2, wherein the non-unique IDs are encoded with an active component for communicating the non-unique IDs.

10. The method of claim 1, further comprising:
    capturing the set of non-unique IDs encoded onto respective nodes of a contiguous subset of nodes of a partially assembled physical structure;
    determining a next step in an assembly process from the determined location; and
    assembling another node according to the determined next step in the assembly process.

11. The method of claim 10, wherein determining the next step in the assembly process is done according to plane maps providing an arrangement of nodes in the complex structure.

12. The method of claim 10, wherein assembly of the other nodes is accomplished using a manipulator type.

13. The method of claim 10, wherein assembly of the other nodes is accomplished using teams of insect robots working independently.

14. The method of claim 10, further comprising disassembling a portion of the complex structure and reusing disassembled components to assemble another portion of the complex structure.

15. The method of claim 1, wherein the nodes are assigned a non-unique ID using a removable shell node having the non-unique ID.

16. A system for determining a location within a 3D physical structure comprising:
 a memory storing instructions; and
 a processor for executing instructions stored in the memory, the executed instructions configuring the system to:
  store a 3D model of the 3D physical structure comprising a plurality of nodes connected by a plurality of struts, each of the nodes and struts of the model corresponding to respective nodes and struts of the physical structure;
  assign a non-unique identifier (ID) to each node of the model according to a pseudo-random sequence, wherein each node of the physical structure encodes the non-unique ID assigned to the corresponding node of the model;
  receive a set of non-unique IDs encoded onto respective nodes of a contiguous subset of nodes of the physical structure;
  locate a set of non-unique IDs in the model corresponding to the received set of non-unique IDs; and
  determine a location in the physical structure from the located set of non-unique IDs in the model.

17. The system of claim 16, wherein the executed instructions further configure the system to:
 decode the received non-unique IDs;
 form the decoded non-unique IDs into a window according to neighbouring nodes of the physical structure; and
 wherein locating the set of non-unique IDs in the model comprises matching the window of non-unique IDs to a model window of non-unique IDs of the model.

18. The system of claim 17, wherein locating the set of non-unique IDs provides a grid location of the window of non-unique IDs within a grid of the pseudo-random sequence.

19. The system of claim 18, wherein the grid location is used to determine the location in the physical structure.

20. The system of claim 17, wherein the non-unique IDs are visually encoded onto the nodes of the physical structure.

21. The system of claim 20, wherein the set of non-unique IDs of the physical structure are received in an image of the physical structure.

22. The system of claim 21, wherein the executed instructions further configure the system to:
 identify nodes in the received image; and
 decode the visually encoded non-unique IDs of the identified nodes.

23. The system of claim 17, wherein the non-unique IDs are encoded onto the nodes of the physical structure using one or more of:
 magnetic encoding; and
 chemical characteristics.

24. The system of claim 16, wherein the executed instructions further configure the system to:
 capture the set of non-unique IDs encoded onto respective nodes of a contiguous subset of nodes of a partially assembled physical structure;
 determine a next step in an assembly process from the determined location; and
 provide instructions for assembling another node according to the determined next step in the assembly process.

25. The system of claim 24, wherein determining the next step in the assembly process is done according to plane maps providing an arrangement of nodes in the complex structure.

26. The system of claim 24, wherein assembly of the other nodes is accomplished using a manipulator type.

27. The system of claim 24, wherein assembly of the other nodes is accomplished using teams of insect robots working independently.

28. The system of claim 24, further comprising disassembling a portion of the complex structure and reusing disassembled components to assemble another portion of the complex structure.

29. The system of claim 16, wherein the nodes are assigned a non-unique ID using a removable shell node having the non-unique ID.

* * * * *